(12) United States Patent
Doris et al.

(10) Patent No.: US 6,509,221 B1
(45) Date of Patent: Jan. 21, 2003

(54) METHOD FOR FORMING HIGH PERFORMANCE CMOS DEVICES WITH ELEVATED SIDEWALL SPACERS

(75) Inventors: Bruce B. Doris, Brewster, NY (US); Omer H. Dokumaci, Wappingers Falls, NY (US); Oleg Gluschenkov, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/000,695

(22) Filed: Nov. 15, 2001

(51) Int. Cl.[7] .................................. H01L 21/8238
(52) U.S. Cl. .................... 438/199; 438/302; 438/305
(58) Field of Search ................................ 438/302, 303, 438/199, 304, 305, 306, 307, 299, 301

(56) References Cited

U.S. PATENT DOCUMENTS

| | | | |
|---|---|---|---|
| 4,417,385 A | | 11/1983 | Temple |
| 4,660,276 A | * | 4/1987 | Hsu ............................. 29/571 |
| 5,416,033 A | | 5/1995 | Lee et al. |
| 5,491,099 A | | 2/1996 | Hsu |
| 5,538,909 A | | 7/1996 | Hsu |
| 5,593,907 A | | 1/1997 | Anjum et al. |
| 5,599,725 A | | 2/1997 | Dorleans et al. |
| 5,620,912 A | * | 4/1997 | Hwang et al. ............... 438/301 |
| 5,811,340 A | | 9/1998 | Park |
| 5,891,792 A | | 4/1999 | Shih et al. |
| 5,899,721 A | * | 5/1999 | Gardner et al. ............. 438/303 |
| 5,909,622 A | | 6/1999 | Kadosh et al. |
| 5,970,353 A | | 10/1999 | Sultan |
| 6,043,130 A | | 3/2000 | Gregory |
| 6,051,863 A | * | 4/2000 | Hause et al. ................. 257/369 |
| 6,066,531 A | | 5/2000 | Akiyama et al. |
| 6,110,790 A | * | 8/2000 | Chen .......................... 438/305 |
| 6,198,144 B1 | * | 3/2001 | Pan et al. .................... 257/412 |

OTHER PUBLICATIONS

U.S. Appl. No. 09/867,874—Structure and method for MOSFET with metallic gate electrode, filed May 30, 2001.

* cited by examiner

*Primary Examiner*—Tuan H. Nguyen
(74) *Attorney, Agent, or Firm*—Jay H. Anderson

(57) ABSTRACT

A method is described for making elevated sidewall spacers on the gate structure of a semiconductor device. A first insulating layer is deposited on the substrate, so that an upper portion of each of the sidewalls extends above the layer. A second insulating layer is deposited on the first layer and on the gate structure. Portions of the second layer disposed on the first layer and on the top surface of the gate structure are removed, so that a remaining portion of the second layer is disposed on the upper portion of each of the sidewalls. The first layer is then removed, so that the remaining portion of the second layer on each of the sidewalls projects laterally therefrom and is elevated with respect to the substrate. This structure is used to implant PFET and NFET extension regions without dose loss.

12 Claims, 6 Drawing Sheets

METHOD FOR FORMING HIGH PERFORMANCE CMOS DEVICES WITH ELEVATED SIDEWALL SPACERS

FIELD OF THE INVENTION

This invention relates to the manufacture of semiconductor devices. More particularly, the invention relates to an improved method for fabricating FET devices when both NFET and PFET devices are to be integrated in the same circuit, for example in high performance CMOS logic circuits.

BACKGROUND OF THE INVENTION

Fabrication of integrated circuits generally involves integration of FET devices. Many high performance circuit designs in the present state of the art include both NFET and PFET devices. A conventional FET fabrication process includes building a gate structure 10 on a substrate (generally a silicon wafer) 1, and using an ion implant process to form source and drain regions 2, 3 (see FIG. 1A). In particular, as shown schematically in FIG. 1A, an ion implant 12 may be used with a blockout mask 11 to form shallow extension regions 4, 5 close to the gate structure. An angled ion implant, where the ions are incident on the substrate at an angle other than 90 degrees, may be used to form extension regions of the source and drain under the gate structure.

In a conventional integration scheme involving the fabrication of both PFET and NFET devices, the extension regions 4, 5 of the NFET are implanted with no sidewall spacer present, as shown in FIG. 1A. A typical addition to this scheme employs a thermal oxidation process (also called reoxidation) to offset the extension regions 4, 5 of the NFET from the edge of the gate structure 10 (see FIG. 1B). The thickness of the reoxidation layer 15 is less than 10 nm, and typically less than about 5 nm.

In order to obtain greater flexibility in device design, sidewall spacers 13 are often formed on the sides of the gate structure 10, to control the spacing of the extensions with respect to the gate (see FIG. 1C); the thickness of the sidewall spacer defines the offset distance for the extension. As shown schematically in FIG. 1C, an ion implant 14 is used with a blockout mask 16 to form the PFET extensions 6, 7 after the sidewall spacers 13 are formed.

Since the spacer 13 is formed on the sidewalls of the gate structure in both NFET and PFET devices, the NFET is subjected to the various spacer processing steps (including spacer deposition, spacer etch and polymer clean) after the NFET extension implant 12. When a reoxidation process is used, a significant portion of the NFET extension ion implant dose remains in the oxide layer; the extension implant is thus divided into portions 4a, 5a in the oxide and very shallow portions 4b, 5b in the substrate. To avoid etching into portions 4b, 5b in the substrate, a spacer etch process is required which is highly selective to the reoxidation. This situation becomes more acute as CMOS devices are scaled so that the reoxidation layer 15 becomes thinner. Loss of the NFET extension implant dose during spacer etch leads to higher extension resistance, which in turn reduces the drive current for the NFET device. (The NFET extension implant process is typically performed using arsenic ions; the spacer formation process has been found to remove about 30% of the As dose.) The potential overetch of the substrate (with resulting extension dose loss) also varies from wafer to wafer; causing unacceptable variations in device parametrics.

Furthermore, if the spacer material is silicon nitride, a polymer clean process is required after the etch process to define the sidewall spacers. The polymer clean is performed by exposing the entire wafer to a residual polymer removal process which results in the growth of oxide on the surface. The oxide layer thus formed may be as much as 6.5 nm thick; accordingly, about 3.0 nm of the Si substrate is consumed as the oxide is formed. This process further reduces the thickness of implanted portions 4b, 5b in the NFET extension. The oxide growth also has undesirable effects on the PFET devices. To obtain very shallow p-type extensions 6, 7 in the PFET, a desirable implant 14 includes a dose of low-energy boron or $BF_2$ ions. The oxide growth prevents the use of low-energy boron or $BF_2$ since the low-energy ions tend to stop in the oxide instead of in the substrate.

There is a need for an improved spacer formation process that permits formation of a shallow PFET extension with the spacer present while avoiding degradation of the implanted NFET device.

SUMMARY OF THE INVENTION

The present invention addresses the above-described need by providing a method for making a semiconductor device which includes a gate structure on a substrate, and elevated sidewall spacers on the gate structure. In accordance with the invention, a method is provided for producing an NFET device, within the context of a CMOS process flow, having improved source/drain extension characteristics by increasing retention of the extension ion implant dose and reducing dose variation from wafer to wafer. A method is also provided for producing a PFET device having ultra-shallow junction extension implants, also within the context of a CMOS process flow.

The elevated sidewall spacers of the present invention are constructed as follows: After gate stack patterning, a first layer is deposited on the substrate. Reoxidation may also be performed before the first layer is deposited. A top portion of the first layer is then removed, so that an upper portion of each of the sidewalls extends above a remaining portion of the first layer. A second layer is deposited on the remaining portion of the first layer and on the gate structure. Portions of the second layer-those disposed on the remaining portion of the first layer and on the top surface of the gate structure-are removed, so that a remaining portion of the second layer is disposed on the upper portion of each of the sidewalls. The remaining portion of the first layer is then removed, so that the remaining portion of the second layer on each of the sidewalls projects laterally therefrom and is elevated with respect to the substrate. The first layer is preferably either self-planarizing or is subjected to a planarization process. The second layer is preferably deposited in a conformal deposition process, so that the second layer is deposited on the top surface and on the sidewalls of the gate structure. The step of removing portions of the second layer preferably comprises a directional etching process; the final step of removing the remaining portion of the first layer preferably comprises a non-directional etching process. The first layer and the second layer may be formed of insulating materials. The remaining portion of the second layer, which forms an elevated spacer, projects from the sidewall by a distance in accordance with the thickness of the deposited second layer.

After the elevated sidewall spacer has been formed, a lithography step may be used to block the PFET regions. Next, an ion implantation process is used to implant the NFET extension at an angle such that the ions are not blocked by the elevated spacer. An additional ion implantation process may be performed at normal incidence to the surface for the NFET extension. The elevated spacer structure of the present invention thus permits a double NFET extension implant, thereby reducing the resistance in the extension and improving device performance. A lithography step may be used to provide a blockout mask covering the NFET device while the PFET device is exposed. The PFET extension is then implanted at normal incidence with respect to the surface, so that the elevated spacer provides an offset of the implant with respect to the edge of the gate structure. An additional, angled, ion implant process may then be done for the PFET extension.

The CMOS devices (NFET and PFET) fabricated according to this method avoid the drawbacks encountered in conventional processing. Specifically, the NFET device does not suffer from ion implant dose loss caused by the PFET spacer etch process. Source and drain extensions for both devices may be implanted using very low energy ion implant processes, because no oxide film is present on the horizontal substrate surface. In addition, the method of the present invention permits ion implant processes for both the NFET and PFET to be performed at multiple incidence angles.

According to another aspect of the invention, a semiconductor device is provided which includes a gate structure disposed on a substrate. The gate structure has a top surface and a sidewall, and a spacer is disposed on the sidewall and projects laterally therefrom. The spacer covers an upper portion of the sidewall and is elevated with respect to the substrate. The spacer may extend along the sidewall from the top surface to a point above a surface of the substrate. The spacer is preferably formed of an insulating material, and may project laterally from the sidewall by a distance determined by a thickness of a layer deposited on the top surface and sidewall of the gate structure.

DETAILED DESCRIPTION OF A PREFERRED EMBODIMENT

FIGS. 2A–2E schematically illustrate a process for forming an elevated sidewall spacer, in accordance with an embodiment of the invention.

Figure 1A:
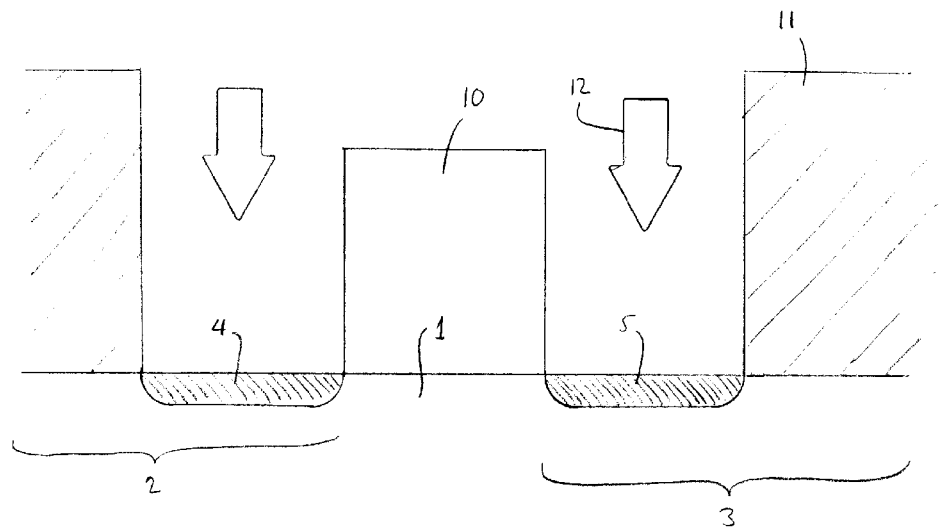
FIG. 1A schematically illustrates an ion implantation process used in forming an NFET structure according to a conventional integration scheme.
Figure 1B:
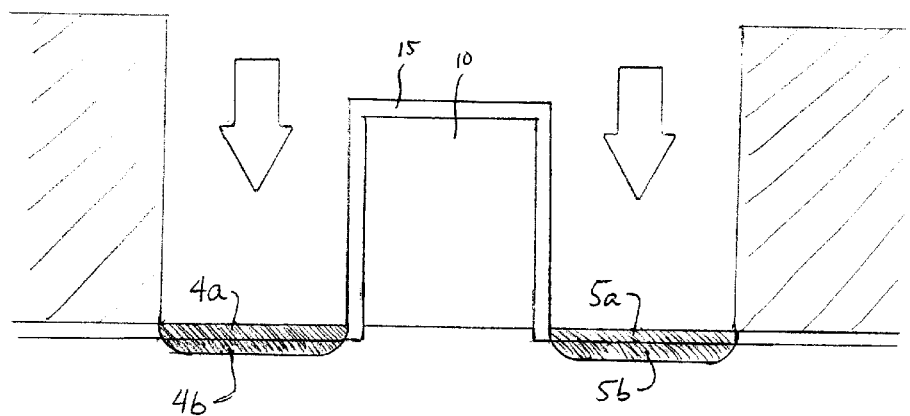
FIG. 1B schematically illustrates an ion implantation process used in forming an NFET structure according to a conventional integration scheme, when a reoxidation process is employed.
Figure 1C:
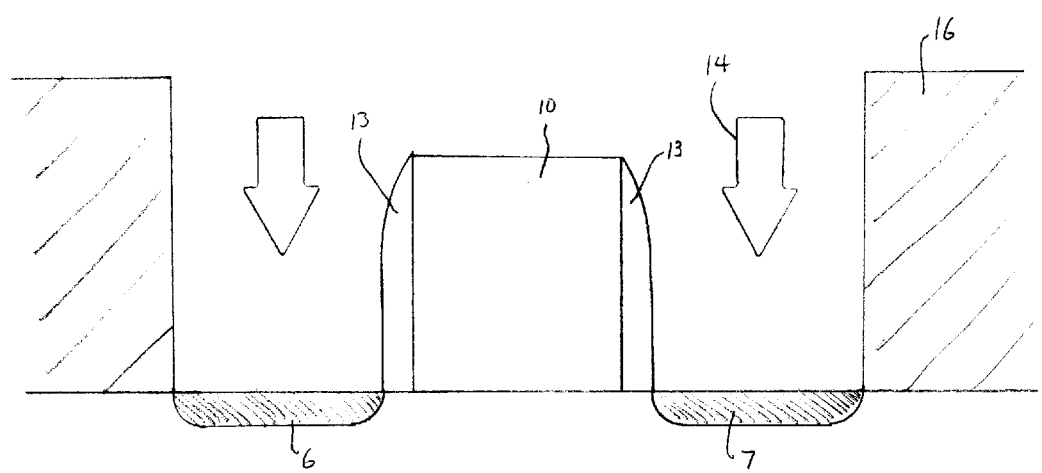
FIG. 1C schematically illustrates an ion implantation process used in forming a PFET structure according to a conventional integration scheme.
Figure 2A:
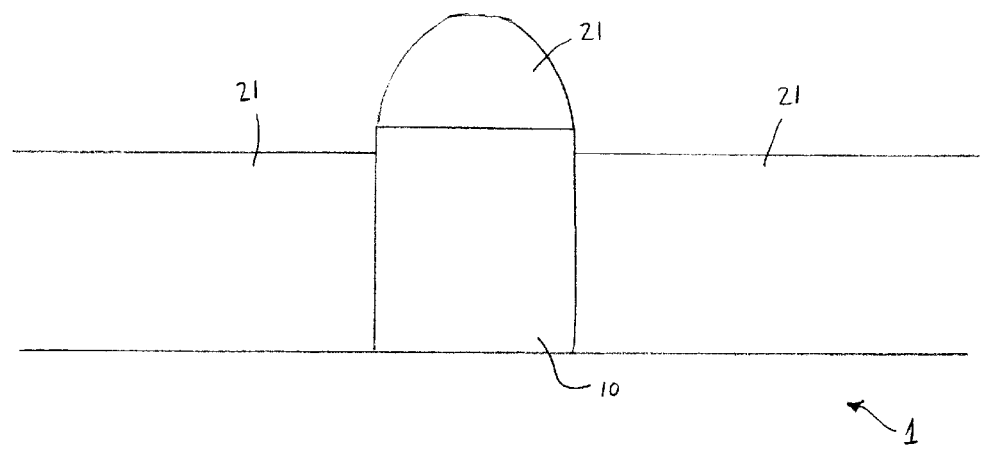
FIGS. 2A–2E illustrate steps in a process for forming an elevated sidewall spacer on the gate structure, in accordance with an embodiment of the present invention.
Figure 2B:
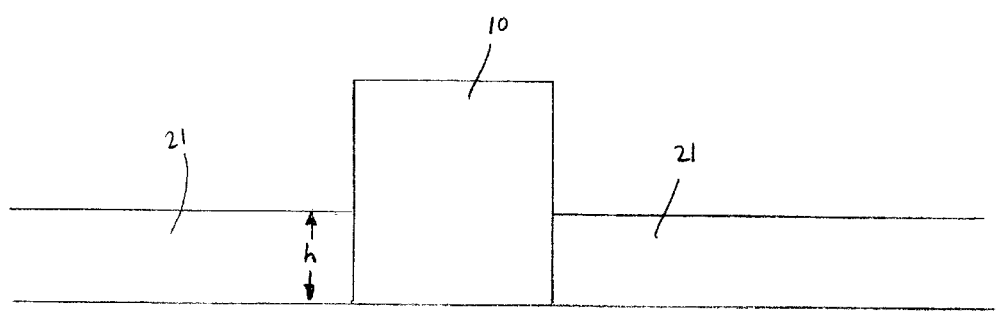

After formation of the gate structure 10 on substrate 1, an oxide is deposited on the substrate and gate using a high-density plasma (HDP). As shown in FIG. 2A, the HDP oxide layer 21 surrounds the gate structure 10 and covers the top surface thereof. The HDP oxide is then partially etched, so that the oxide covering the top surface of the gate structure is removed and the gate structure is exposed above a height h (see FIG. 2B). Accordingly, the upper portion of the sidewalls of the gate structure and the top surface of the gate structure are exposed. The oxide etch process may be either directional or non-directional, but must be selective with respect to the gate structure 10; several processes for performing this etch are known in the art.

Alternatively, the HDP film may be deposited with a thickness less than the height of the gate structure, thereby eliminating the need for the oxide etch process. The difference between the height of the gate structure and the HDP film thickness defines the vertical extent of the elevated sidewall spacer.

Figure 2C:
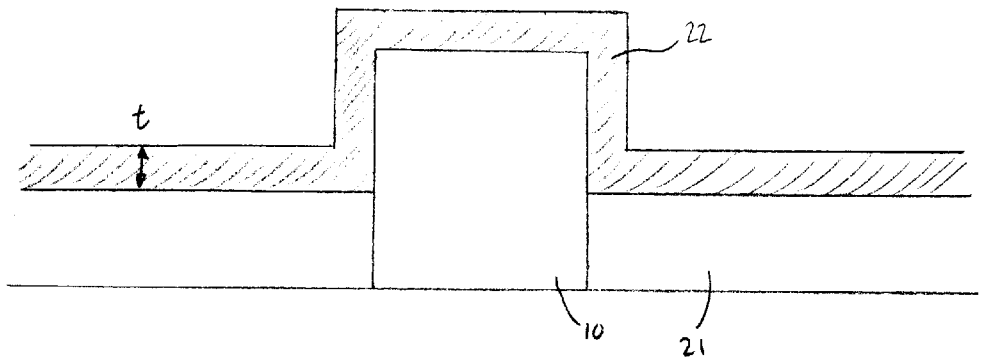
Figure 2D:
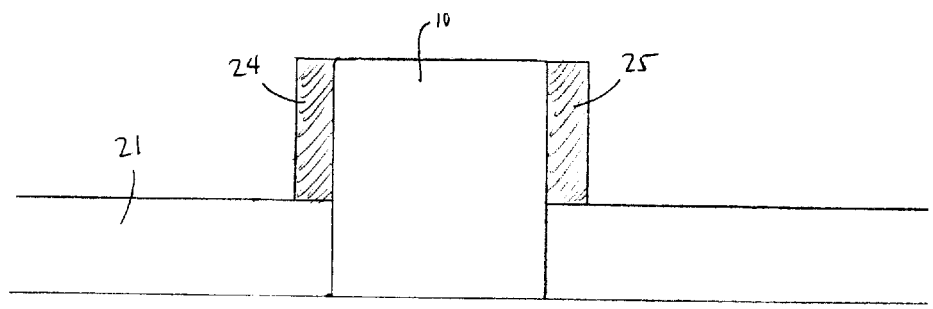

A conformal layer 22, preferably of silicon nitride, is then deposited over oxide layer 21 and the exposed portion of gate structure 10, as shown in FIG. 2C. Layer 22 is preferably deposited by chemical vapor deposition (CVD) or plasma-enhanced CVD, and has a thickness t of about 10–50 nm. This layer is then removed from the top of gate structure 10 and from the top of oxide layer 21 using a directional etch process, preferably a reactive-ion etch (RIE) process. The result of the RIE process is shown in FIG. 2D, the only remaining portions of layer 22 are on the vertical sidewalls of the gate structure, so that vertical sidewall spacers 24, 25 are formed. Finally, the remainder of oxide layer 21 is completely removed by an additional etch process (see FIG. 2E). It should be noted that oxide is removed from the areas 26, 27 underneath the spacers 24, 25, so that the lower portion of the sidewall is exposed and the spacers are elevated above the substrate by the height h. Accordingly, a wet etch or non-directional dry etch process may be used for removing layer 21. The thickness t of the spacers 24, 25 corresponds to the deposition thickness of conformal layer 22.

It is also noteworthy that the elevated sidewall spacers are formed before the ion implant process for the NFET extension region. The problem of degradation of the As-doped region due to spacer processing is therefore avoided.

Figure 2E:
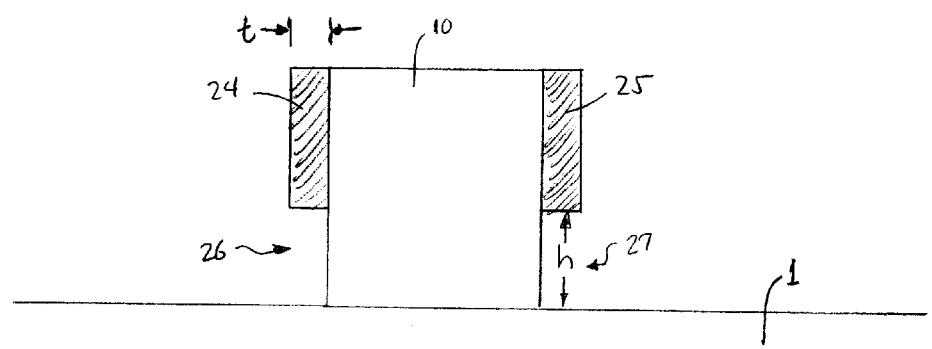

The elevated spacer structure of FIG. 2E allows a normal-incidence ion implant process to form a doped area in substrate I with an offset distance from the gate structure 10 equal to the thickness t of the spacer, but also allows an angled-incidence ion implant process to form a doped area adjacent to or underneath the sidewall spacer and gate structure. Both of these alternatives are used in the fabrication of PFET and NFET devices, respectively, and provide advantages compared to conventional CMOS processing which in turn provide improved device performance.

Figure 3A:
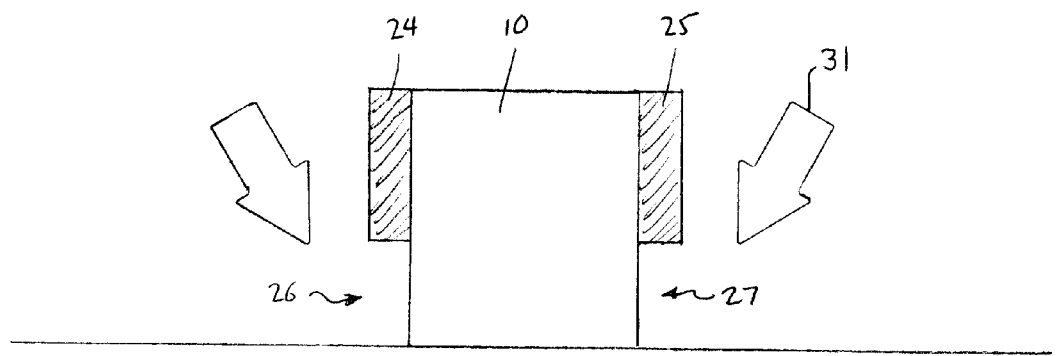
FIGS. 3A and 3B schematically illustrate ion implantation processes for forming extension regions in NFET and PFET devices respectively, in accordance with an embodiment of the present invention.

FIG. 3A is a schematic illustration of NFET extension regions being formed using an angled-incidence ion implant 31, after formation of the elevated sidewall spacers 24, 25. Ion implant 31 is preferably performed using As ions; P or Sb ions may also be used. The ion implant dose for the NFET extension region is greater than $1 \times 10^{14}$ atoms/cm$^2$. In this case, since areas 26, 27 are not covered by the spacers, the angled-incidence process is effective in forming the desired extension regions. The NFET extension regions may then optionally be implanted at normal incidence, to further reduce the extension resistance without compromising short-channel effects.

Figure 3B:
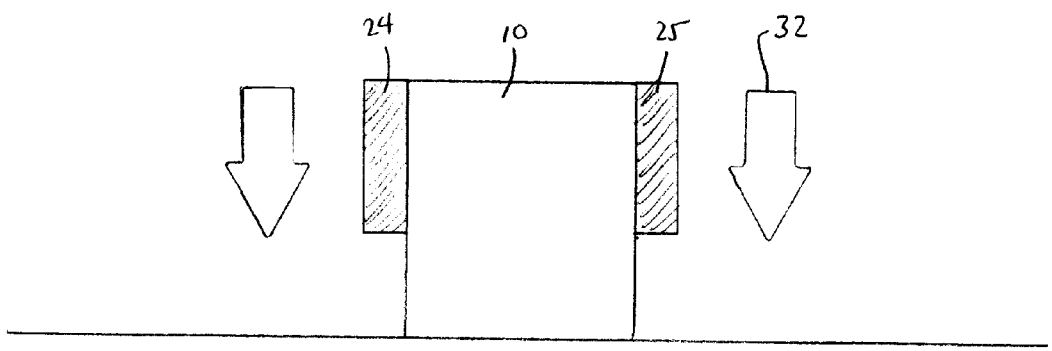

FIG. 3B is a schematic illustration of PFET extension regions being formed using a normal-incidence ion implant 32 (e.g. with B or $BF_2$ ions). In this case, the spacers are effective to control the distance between the doped region and the gate structure 10.

The formation of elevated spacers, prior to either ion implant process, avoids the problem of As or $B/BF_2$ dose loss due to spacer processing. Since both implant processes are performed after the spacers are formed, the implant processes may be performed in either order.

Figure 4:
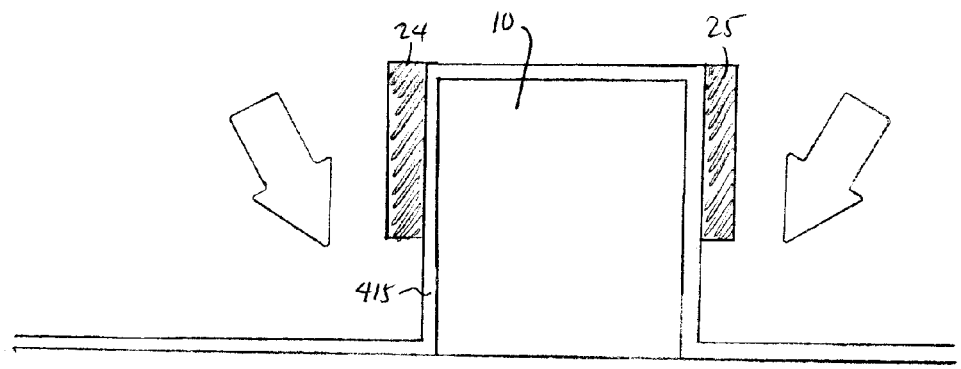
FIG. 4 schematically illustrates an ion implantation process for forming an extension region in an NFET device, when a reoxidation process has previously been performed.

The elevated sidewall spacer structure also permits the extension regions for the NFET and PFET devices to be implanted using ultra-low-energy ion implant processes which require a bare Si surface so that the implant dose is not trapped in an oxide film. Alternatively, a reoxidation process may be performed before the deposition of layers 21 and 22, so that the elevated spacers 24, 25 are disposed on a thin oxide layer. FIG. 4 schematically illustrates an angled-incidence ion implant process for an NFET extension region, when the elevated spacers are formed after a reoxidation process. A portion 415 of the oxide layer (less than 10 nm thick) remains on the sidewall underneath the elevated spacer, the oxide layer serves to offset the implanted extension region from the edge of the gate structure 10 (compare FIG. 3A).

While the present invention has been described in conjunction with specific preferred embodiments, it would be apparent to those skilled in the art that many alternatives, modifications and variations can be made without departing from the scope and spirit of the invention. Accordingly, the invention is intended to encompass all such alternatives, modifications and variations which fall within the scope and spirit of the invention and the following claims.

We claim:

1. A method for making a semiconductor device having an NFET device and a PFET device, each of the NFET device and the PFET device including a gate structure on a substrate, the gate structure having a top surface and sidewalls, the method comprising the steps of:

forming a spacer disposed on each of the sidewalls and projecting laterally therefrom, the spacer covering an upper portion of the sidewall and being elevated with respect to the substrate;

performing a first ion implantation at an angle of incidence other than normal to the substrate, thereby forming an implanted region in the substrate adjacent to the NFET gate structure, and performing a second ion implantation at normal incidence to the substrate, thereby forming an implanted region in the substrate offset from the PFET gate structure in accordance with a lateral projection distance of the spacer.

2. The method of claim 1, wherein said step of forming a spacer comprises:

forming a first layer on the substrate;

depositing a second layer on the first layer and on the gate structure;

removing portions of the second layer disposed on the first layer and on the top surface of the gate structure, so that a remaining portion of the second layer is disposed on the upper portion of each of the sidewalls; and removing the first layer, so that the remaining portion of the second layer on each of the sidewalls projects laterally therefrom and is elevated with respect to the substrate, the lateral projection distance being determined by a thickness of the second layer.

3. The method of claim 2, wherein said step of removing portions of the second layer comprises a directional etching process.

4. The method of claim 2, wherein said step of forming the first layer comprises:

depositing the first layer on the substrate; and removing a top portion of the first layer, so that an upper portion of each of the sidewalls extends above the first layer.

5. The method of claim 4, wherein said step of removing a top portion of the first layer comprises a non-directional etching process.

6. The method of claim 2, wherein the first layer and the second layer are of insulating materials.

7. The method of claim 1, wherein the substrate includes an NFET device area and a PFET device areas, said step of performing the first ion implantation further comprises masking the substrate so that the NFET device area is exposed and the PFET device area is masked, and said step of performing the second ion implantation further comprises masking the substrate so that the PFET device area is exposed and the NFET device area is masked.

8. The method of claim 1, further comprising the step of forming an oxide layer on the substrate and on the sidewalls of the gate structure, before said step of forming a spacer.

9. The method of claim 8, wherein the oxide layer has a thickness not greater than 10 nm, and the first ion implantation process forms an implanted region in the substrate offset from the NFET gate structure in accordance with said oxide layer thickness.

10. The method of claim 1, wherein the first ion implantation process is performed using ions selected from the group consisting of As, P and Sb ions.

11. The method of claim 1, further comprising the step of performing an additional ion implantation after the first ion implantation, said additional ion implantation being performed at normal incidence to the substrate, thereby forming an additional implanted region in the substrate offset from the NFET gate structure in accordance with the lateral projection distance of the spacer.

12. The method of claim 1, wherein the first ion implantation is performed with an implantation dose greater than $1 \times 10^{14}$ atoms/cm$^2$.

* * * * *